United States Patent [19]
VanDeusen et al.

[11] Patent Number: 5,453,744
[45] Date of Patent: Sep. 26, 1995

[54] DEVICE FOR MODULAR INPUT HIGH-SPEED MULTI-CHANNEL DIGITIZING OF ELECTRICAL DATA

[75] Inventors: Alan L. VanDeusen, Lee's Summit, Mo.; Charles E. Crist, Waxahachie, Tex.

[73] Assignee: AlliedSignal Inc., Morristown, N.J.

[21] Appl. No.: 156,048

[22] Filed: Nov. 23, 1993

[51] Int. Cl.⁶ .................................................... H03M 1/12
[52] U.S. Cl. ............................................ 341/155; 341/110
[58] Field of Search ....................................... 341/155, 108, 341/110, 122, 123, 126, 138, 156; 360/32; 364/825, 45

[56] References Cited

U.S. PATENT DOCUMENTS 4,707,786  11/1986  Dehner .................................... 364/414
4,878,194  10/1989  Nakatsugawa et al. .
4,963,866  10/1990  Duncan .................................... 341/110
5,028,914   7/1991  Povenmire .
5,153,501  10/1992  Shimada et al. .

Primary Examiner—Brian K. Young
Attorney, Agent, or Firm—Frank B. Flink, Jr.

[57] ABSTRACT

A multi-channel high-speed digitizer module converts a plurality of analog signals to digital signals (digitizing) and stores the signals in a memory device. The analog input channels are digitized simultaneously at high speed with a relatively large number of on-board memory data points per channel. The module provides an automated calibration based upon a single voltage reference source. Low signal noise at such a high density and sample rate is accomplished by ensuring the A/D converters are clocked at the same point in the noise cycle each time so that synchronous noise sampling occurs. This sampling process, in conjunction with an automated calibration, yields signal noise levels well below the noise level present on the analog reference voltages.

8 Claims, 1 Drawing Sheet

DEVICE FOR MODULAR INPUT HIGH-SPEED MULTI-CHANNEL DIGITIZING OF ELECTRICAL DATA

The U.S. Government has rights in this invention pursuant to contract numbers DE-AC04-76DP00613 and DE-AC35-89-ER40486 with the United States Department of Energy.

BACKGROUND OF THE INVENTION

Field of the Invention

The present invention relates to an analog to digital converter and particularly to an apparatus to perform high-speed (20 million samples per second (MSPS) nominal) high-precision (60 dB nominal resolution) multi-channel (six or more channels) analog electrical signal digitizing (multi-sample analog to digital data conversion and memory storage in a computer-accessible format) on a single standard (e.g., C-size VXI) computer board.

Description of the Prior Art

High-speed commercial digitizers currently are available with only one channel per board. In order to accommodate a large number of data points, more boards are required, however the multiplicity of boards causes timing and size limitation problems. Further, standard digitizer design can not simply be condensed onto a single board due to errors introduced by system noise and calibration problems. It is a primary object of this invention to avoid these concerns.

SUMMARY OF THE INVENTION

The present invention provides a compact, high-speed, high-precision, multi-input digitizer board which may be used alone or banked with other digitizer boards to capture high-speed multi-point electrical events. In order to accomplish this, the present invention incorporates synchronous sampling of input data to minimize the impact of internal system electronic "noise," and utilizes a singlepoint automatic calibration of all of the input data points, both of which are controlled by a programmable logic device (PLD).

The invention increases the point density of a high-speed digitizer to get at least six channels per board; includes a computer programmable amplifier on the board for variable input gain control and integrates the system so that on-line automated calibration is performed with the application of a single external voltage reference. The invention includes multiple high-speed analog-to-digital converters (ADCs) integrally coupled with digital data storage capacity to allow capture of multiple short duration multi-pan electronic events. The invention incorporates simultaneous multi-channel fixed rate digitizing to reduce electronic noise and allow multi-channel digitizing on a single standard computer board while maintaining high-precision data conversion. The invention also incorporates a single-point automated calibration to allow simultaneous calibration of all board data points.

DETAILED DESCRIPTION OF THE INVENTION

Figure 1:
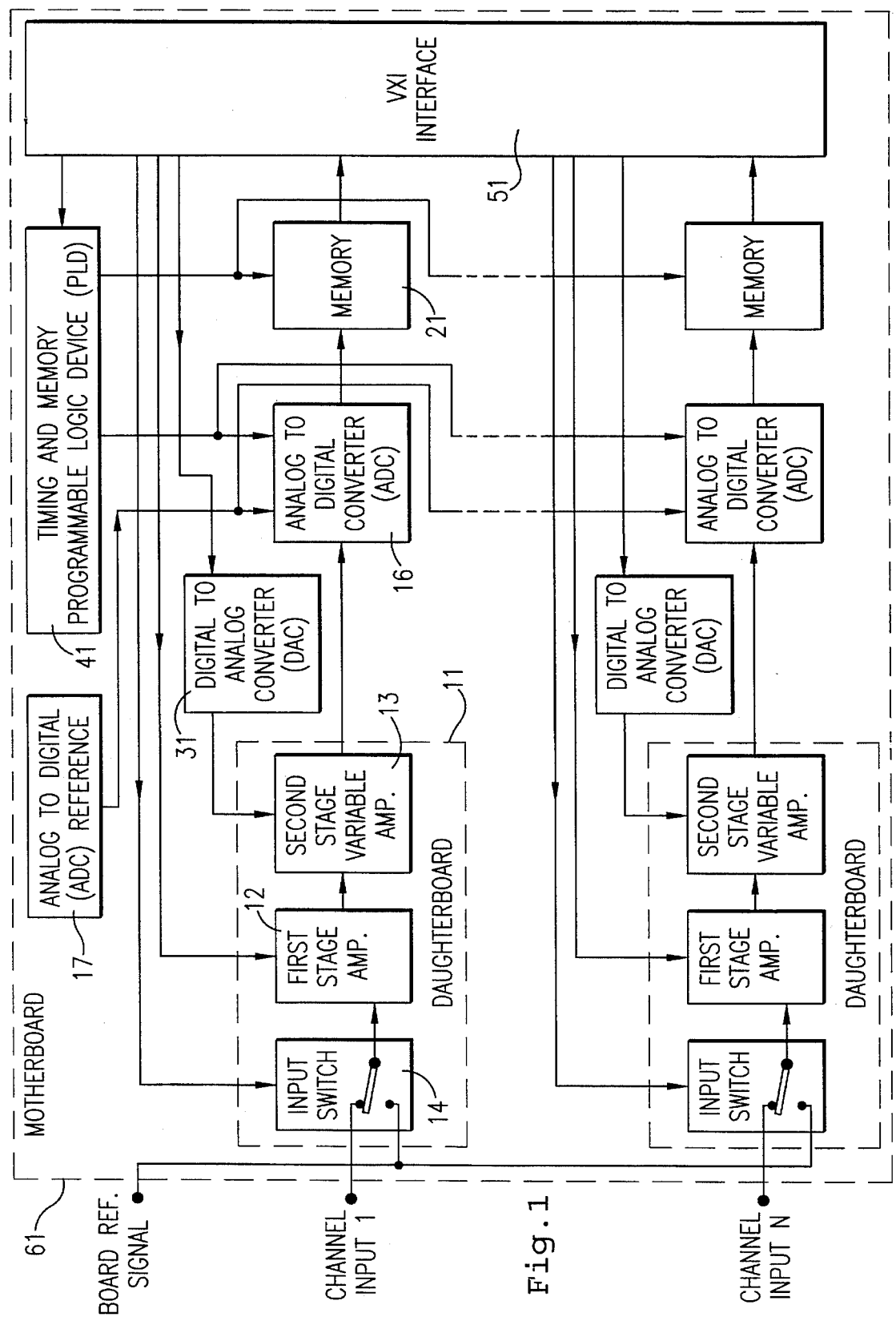
FIG. 1 is a block diagram of a multi-channel digitizer board according to the present invention showing two typical channels.

The present invention was developed to solve an application in which 128 channels of data were to be sampled simultaneously. The application required a compact, generally portable system. The preferred embodiment of the present invention utilizes a standard VXI interface, in accordance with the Institute of Electrical and Electronic Engineers (IEEE) standard P1155. The VXI interface is a computer interface to either a stand-alone computer or a VXI rack-mounted computer. The VXI interface provides a plurality of control commands to other components of the present invention.

FIG. 1 shows two channels, the first and last (Nth) channel, of a plurality of channels in the preferred embodiment of the present invention, as well as several devices shared by all channels. Each channel of the preferred embodiment of the present invention is comprised of an input switch 14, a first stage amplifier 12, a second stage amplifier 13, a flash analog to digital converter (ADC) 16, a memory 21, and a digital to analog converter (DAC) 31, interconnected as described below. The preferred embodiment of the present invention is configured to handle 8 channels per board. In addition to the multiple channels there is a VXI interface 51, a programmable logic device (PLD) 41, and an ADC reference 17 mounted on a board.

Each channel input is to terminals on a single standard computer board, referred to as a motherboard 61 which is routed to a series of daughterboards 11 upon which signal scaling is performed in the first stage amplifier 12 and the second stage amplifier 13. The first stage amplifier 12 provides a coarse range adjustment to the channel input. This first stage has a plurality of ranges, the selection of which is controlled by a digital control command from the VXI interface 51. The second stage amplifier 12 provides a fine adjustment output of the first stage amplifier. This fine adjustment is controlled by an analog signal from the DAC 31. The DAC 31 analog signal is controlled by a digital control command from the VXI interface 51.

The analog output of the second stage amplifier 13 is input to the flash analog-to-digital converter (ADC) 16. A single ADC reference 17 provides a reference signal to all ADCs on the board 61. The timing of the "flash" conversion in the ADC 16 is controlled by a converter timing signal from a programmable logic device (PLD) 41, which also provides a memory timing signal to the memory 21 associated with each channel. Upon command from the VXI interface 51 through the PLD 41, the memory 21 discharges the stored data to the VXI interface 51 which provides the data as output to a computer (not shown).

In calibration mode, the input switch 14, controlled through a control command from the VXI interface 51, is set to receive a board reference signal input. This board reference signal is routed through the normal channel signal conversion described above to the VXI interface 51 where it is output to the computer. In the computer, the sensed value of the board reference signal is compared to an expected value of the board reference signal. The computer produces an adjustment factor and outputs the factor to the VXI interface. The VXI interface then provides a digital signal to the DAC 31 to adjust the second stage amplifier 13. The computer continues to produce adjustment factors until the reference signal is equal to the expected signal.

The PLD 41 utilizes a typical digitizer sampling scheme. Each channel on a board receives the same PLD commands in parallel. The PLD 41 controls operation of the ADC 16 and the memory device 21. In the memory device 21, signals from the ADC 16 are stored in a plurality of memory locations as directed by a memory pointer. If the memory pointer is not incremented, any new data from the ADC overwrites previous data stored at that memory location. The typical sampling scheme involves a RESET during which no sampling is done and the ADC 16 does not operate; an ARM state during which the ADC 16 runs at full speed but the memory pointer does not increment; and a TRIGGER state during which the memory pointer is incremented and a pre-selected number of samples are taken. The preferred embodiment includes provisions to allow multiple trigger cycles to be recorded in memory for later retrieval.

The daughterboards 11 are physically mounted on the motherboard 61. This embodiment of the present invention is configured to occupy a single standard slot in a standard VXI rack.

Accuracy—Noise Reduction

One key problem to overcome in incorporation of multiple high-speed channels on a single standard circuit board is noise. Flash ADCs are the only type that will operate at speeds of 20 MSPS. A flash ADC operates by comparing the magnitude of the input signal to a fixed ADC reference signal. Noise on either the fixed ADC reference signal or the input signal can cause measurement errors. Flash converters require significant amounts of electrical power to operate, and, as a result, produce a significant amount of system noise. For example, in order to control noise error to a target of 1 percent on a flash converter with a ±50 mV input, the ADC reference signal would have to be maintained within ±5 mV. However, a board containing eight flash converters uses over 40 watts of power at 20 MHz and produces ±50 mV electronic noise on the ADC reference signal, resulting in a 10 percent noise error.

In order to minimize the errors produced by this electronic noise, the present invention utilizes synchronous noise sampling (SNS). SNS makes use of the fact that if the system is run at a set rate, the noise signal created by the board components repeats at that rate creating a dominant noise cycle at the set rate. In SNS, the object is to make the noise as repeatable as possible so that the impact of the noise may be minimized. This is accomplished by taking the sample at precisely the same time during the dominate noise cycle. In the preferred embodiment, SNS was accomplished by forcing all channels to run simultaneously off a common local control bus and running the board at only a set rate of 20 MSPS. When channel calibration is performed at the normal sample rate as described above, because the dominant noise produces a generally fixed offset in the signal input to the ADC 16, the effect of the dominant noise offset is inherently compensated for in the individual input amplifier calibration.

Noise reduction on the input signal was obtained by using a differential input ADC 16. With the analog daughterboards located in the same enclosure, the 20 MHz dominate noise causes errors in the input amplifiers 12, 13. By bringing the output of the daughterboard to a differential input ADC 16 (daughterboard ground to ADC−, and daughterboard signal to ADC+) this coupled noise was greatly reduced.

By utilizing this SNS concept and the differential input flash converters, sampling errors of less than one percent of full scale were obtained even though the ADC reference 17 voltages varied by more than five percent of full scale. By not varying the sample rate to the converter (as commercially available digitizers typically do) and by using the on-board calibration features, an accuracy level of less than 1 percent error was obtained.

Accuracy—Calibration Technique

Typically, available existing digitizers are calibrated by applying a known input signal and adjusting the reference voltage to each ADC individually. This requires individual adjustable reference signal generators for each channel.

The present invention utilizes a single fixed reference voltage, eliminating the need for variable ADC reference signal generators. The channels on the preferred embodiment are calibrated utilizing the fine adjustment capability of the second stage amplifier 13 as controlled by the VXI interface-controlled DAC 31 . This reduces board parts count, further reducing system noise.

It is not intended that this invention be limited to the hardware or software arrangement shown or disclosed. This invention includes all of the alterations and variations thereto as encompassed within the scope of the claims as follows.

What is claimed is:

1. A device for modular input high-speed, multi-channel digitizing of electrical data comprising:

a plurality of channels;

computer interface means connected to each of said plurality of channels for producing a plurality of control commands and for providing data analysis to a computer and for receiving commands from said computer;

programmable timing means connected to said computer interface means and to each of said plurality of channels for receiving one or more of said plurality of control commands and for providing a converter timing signal and a memory timing signal to operate said plurality of channels synchronously and at a fixed digitizing rate; wherein each of said plurality of channels comprises:

signal switching means for receiving an external analog signal, an analog board reference calibration signal, and a second of said plurality of control commands and for providing a selected analog signal, wherein said selected analog signal is selected from either said external analog signal or said analog board reference calibration signal based upon said second of said plurality of control commands to said signal switching means;

amplifier means connected to said signal switching means for receiving said selected analog signal and a third of said plurality of control commands; for amplifying said selected analog signal as a function of said third of said plurality of control commands to produce a conditioned analog signal;

flash analog-to-digital converter means for receiving said conditioned analog signal and said converter timing signal and for providing a converted digital signal wherein said conditioned analog signal is converted to a converted digital signal upon receipt of certain converter timing signals; and, memory means for receiving said converted digital signal and said memory timing signal wherein said memory means stores a plurality of said converted digital signals upon receipt of said memory timing signal and provides a memory signal to said computer interface means upon receipt of certain timing signals thereby transferring said stored plurality of converted digital signals to said computer interface means.

2. A device for modular input high-speed multi-channel digitizing of electrical data, as described in claim 1 wherein said amplifier means comprises:

a first amplifier which is a coarse adjustment amplifier having a plurality of ranges selected by said plurality of control commands; and, a second amplifier which is a fine adjustment variable amplifier coupled to a digital-to-analog converter, said digital-to-analog converter comprising an input for receiving said plurality of control commands and thereby providing a fine input amplification adjustment and calibration adjustment for said conditioned analog signal.

3. A device for modular input high-speed multi-channel digitizing of electrical data, as described in claim 2 wherein said computer interface means comprises a IEEE P1155 VXI interface.

4. A device for modular input high-speed multi-channel digitizing of electrical data, as described in claim 2 wherein said device is mounted on a C-size VXI board.

5. A device for modular input high-speed multi-channel digitizing of electrical data, as described in claim 2 wherein digitizing rate of said device is set at a nominal speed of 20 million samples per second per channel.

6. A device for modular input high-speed multi-channel digitizing of electrical data, as described in claim 2 wherein said flash analog to digital converter means comprises a differential input flash analog to digital converter coupled to said amplifier means to reduce electronic noise effects.

7. A device for modular input high-speed multi-channel digitizing of electrical data as described in claim 2 wherein digitizing rate of said device is set at a fixed cycle speed of 20 million samples per second per channel whereby digitizing occurs at same point in a cycle thereby minimizing effects of cyclical noise and wherein said flash analog to digital converter means comprises a differential input flash analog to digital converter coupled to said amplifier means to reduce electronic noise effects.

8. A device for modular input high, speed, multi-channel digitizing of electrical data, comprising:

a plurality of channels;

computer interface means connected to each of said plurality of channels for producing a plurality of control commands and for providing data analysis to a computer and for receiving commands from said computer, wherein said computer interface means comprises a IEEE P1155 VXI interface;

programmable timing means connected to said computer interface means and to each of said plurality of channels for receiving one or more of said plurality of control commands and for providing a converter timing signal and a memory timing signal to operate said plurality of channels synchronously and at a fixed digitizing cycle rate of nominally 20 million samples per second whereby digitizing occurs at the same point in the cycle thus minimizing effects of cyclical noise; wherein each of said plurality of channels comprises:

signal switching means for receiving an external analog signal, an analog board reference calibration signal, and other of said control commands and for providing a selected analog signal, wherein said selected analog signal is selected from either said external analog signal or said analog board reference calibration signal based upon said control commands to said signal switching means;

amplifier means connected to said signal switching means for receiving said selected analog signal and other of said computer interface control commands for amplifying said selected analog signal as a function of said computer interface control commands to produce a conditioned analog signal, said amplifier means including a first amplifier which is a coarse adjustment amplifier with a plurality of ranges selected by other of said computer interface control commands and a second amplifier which is a fine adjustment variable amplifier coupled to a digital-to-analog converter, said digital-to-analog converter including an input for receiving other of said computer control commands and thereby providing a fine input amplification adjustment and calibration adjustment for said conditioned analog signal;

flash analog-to-digital converter means for receiving said conditioned analog signal and said converter timing signal and for providing a converted digital signal wherein said conditioned analog signal is converted to a converted digital signal upon receipt of certain converter timing signals and wherein said flash analog to digital converter means includes a differential input flash analog to digital converter coupled to said amplifier means to reduce electronic noise effects; and, memory means for receiving said converted digital signal and said memory timing signal wherein said memory means stores a plurality of said digital signals upon receipt of certain said memory timing signal and provides a memory signal to said computer interface upon receipt of certain timing signals thereby transferring said plurality of stored digital signals to said computer interface.

* * * * *